(12) United States Patent
Cheng et al.

(10) Patent No.: US 10,170,608 B2
(45) Date of Patent: Jan. 1, 2019

(54) INTERNAL SPACER FORMATION FROM SELECTIVE OXIDATION FOR FIN-FIRST WIRE-LAST REPLACEMENT GATE-ALL-AROUND NANOWIRE FET

(71) Applicant: International Business Machines Corporation, Armonk, NY (US)

(72) Inventors: Szu-Lin Cheng, Yorktown Heights, NY (US); Michael A. Guillorn, Yorktown Heights, NY (US); Gen P. Lauer, Yorktown Heights, NY (US); Isaac Lauer, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/754,751

(22) Filed: Jun. 30, 2015

(65) Prior Publication Data

US 2017/0005180 A1    Jan. 5, 2017

(51) Int. Cl.
*H01L 29/06* (2006.01)
*H01L 29/775* (2006.01)
(Continued)

(52) U.S. Cl.
CPC ........ *H01L 29/775* (2013.01); *H01L 29/0649* (2013.01); *H01L 29/0673* (2013.01); *H01L 29/0676* (2013.01); *H01L 29/1054* (2013.01); *H01L 29/401* (2013.01); *H01L 29/42392* (2013.01); *H01L 29/66439* (2013.01); *H01L 29/66545* (2013.01); *H01L 29/66553* (2013.01); *H01L 29/66795* (2013.01);
(Continued)

(58) Field of Classification Search
CPC ............ H01L 29/66795; H01L 29/785; H01L 29/0673; H01L 29/42392
See application file for complete search history.

(56) References Cited

U.S. PATENT DOCUMENTS 6,251,751 B1    6/2001  Chu et al.
7,892,945 B2    2/2011  Bedell et al.
(Continued)

OTHER PUBLICATIONS

Cornu-Fruleux et al., "Spacer-first damascene-gate FinFET architecture featuring stringer-free integration," IEEE Electron Device Letters, vol. 28, No. 6, 2007, pp. 523-526.
(Continued)

*Primary Examiner* — Mark Prenty
(74) *Attorney, Agent, or Firm* — Cantor Colburn LLP; Vazken Alexanian

(57) ABSTRACT

A semiconductor device includes a first source/drain region a second source/drain region, and a gate region interposed between the first and second source/drain regions. At least one nanowire has a first end anchored to the first source/drain region and an opposing second end anchored to the second source/drain region such that the nanowire is suspended above the wafer in the gate region. At least one gate electrode is in the gate region. The gate electrode contacts an entire surface of the nanowire to define a gate-all-around configuration. At least one pair of oxidized spacers surrounds the at least one gate electrode to electrically isolate the at least one gate electrode from the first and second source/drain regions.

12 Claims, 22 Drawing Sheets

(51) Int. Cl.
*H01L 29/786* (2006.01)
*H01L 29/423* (2006.01)
*H01L 29/66* (2006.01)
*H01L 29/10* (2006.01)
*H01L 29/40* (2006.01)
*H01L 29/78* (2006.01)

(52) U.S. Cl.
CPC ...... *H01L 29/785* (2013.01); *H01L 29/78642* (2013.01); *H01L 29/78654* (2013.01); *H01L 29/78696* (2013.01)

(56) References Cited

U.S. PATENT DOCUMENTS

| | | | |
|---|---|---|---|
| 7,923,337 B2 | 4/2011 | Chang et al. | |
| 8,084,308 B2 | 12/2011 | Chang et al. | |
| 8,637,359 B2 | 1/2014 | Chang et al. | |
| 8,716,797 B2 * | 5/2014 | Basker | H01L 21/26586 257/347 |
| 8,753,942 B2 | 6/2014 | Kuhn et al. | |
| 8,778,768 B1 | 7/2014 | Chang et al. | |
| 8,809,131 B2 | 8/2014 | Bangsaruntip et al. | |
| 9,252,275 B2 * | 2/2016 | Rachmady | H01L 29/42392 |
| 9,716,091 B2 * | 7/2017 | Lin | H01L 27/0886 |
| 9,893,167 B2 * | 2/2018 | Kim | H01L 29/66553 |
| 2014/0217364 A1 | 8/2014 | Chang et al. | |

OTHER PUBLICATIONS

Lee et al., "A novel sub-50 nm multi-bridge-channel MOSFET (MBCFET) with extremely high performance," Symposium on VLSI Technology, 2004, pp. 200-201.

Cheng et al., "Internal Spacer Formation From Selective Oxidation for Fin-First Wire-Last Replacement Gate-All-Around Nanowire FET", U.S. Appl. No. 14/948,509, filed Nov. 23, 2015.

List of IBM Patents or Patent Applications Treated as Related; (Appendix P), Filed Jan. 28, 2016; 2 pages.

* cited by examiner

INTERNAL SPACER FORMATION FROM SELECTIVE OXIDATION FOR FIN-FIRST WIRE-LAST REPLACEMENT GATE-ALL-AROUND NANOWIRE FET

BACKGROUND

The present invention relates to semiconductor devices, and more particularly, to nanowire field effect transistor (FET) devices.

A field-effect transistor (FET) includes a source region, a drain region and a channel between the source and drain regions. A gate is formed over the channel and regulates electron flow through the channel between the source and drain regions. Recent trends to reduce the size of FET devices have led to the development of gate-all-around nanowire channel field effect transistors (e.g., nanowire FETs). Nanowire FETs are expected to enable density scaling beyond current planar CMOS technology due to their superior electrostatic characteristics. There are, however, notable challenges related to fabricating gate-all-around nanowire FETs, especially at scaled dimensions. For instance, to increase layout density, the nanowires are placed close together and/or are stacked. Consequently, forming a gate surrounding the nanowires in this case is challenging.

When forming a nanowire FET, typical fabrication methods include first forming a semiconductor fin on an upper surface of a substrate, and subsequently etching a bottom portion of the fin to form a void that defines the semiconductor nanowire. In this manner, a gate electrode fills the void and wraps around all sides of the nanowire to form a gate-all-around nanowire FET. However, removal of the bottom portion reduces the overall dimensions of semiconductor material, which in turn decreases the current density provided by the nanowire.

SUMMARY

According to at least one non-limiting embodiment of the present invention, a semiconductor device includes a first source/drain region, a second source/drain region, and a gate region interposed between the first and second source/drain regions. At least one nanowire has a first end anchored to the first source/drain region and an opposing second end anchored to the second source/drain region such that the nanowire is suspended above the wafer in the gate region. At least one gate electrode is in the gate region. The gate electrode contacts an entire surface of the nanowire to define a gate-all-around configuration. At least one pair of oxidized spacers surrounds the at least one gate electrode to electrically isolate the at least one gate electrode from the first and second source/drain regions.

According to another non-limiting embodiment, a method of fabricating a nanowire field-effect transistor (FET) device comprises forming at least one stacked multi-semiconductor layer fin on an upper surface of a wafer. The at least one stacked multi-semiconductor layer fin including at least one semiconductor fin portion interposed between an opposing pair of sacrificial fin portions. The method further includes forming at least one dummy gate stack including a dummy gate on an upper surface of the at least one stacked multi-semiconductor layer fin. The method further includes etching the stacked multi-semiconductor layer fin while using the at least one dummy gate stack as a mask to preserve an underlying semiconductor fin portion and an underlying sacrificial fin portion. The method further includes forming oxidized spacers on sidewalls of the underlying sacrificial fin portions beneath the dummy gate. The method further includes removing the dummy gate to form trenches that expose the sacrificial fin portions and selectively etching the exposed sacrificial fin portions with respect to the oxidized spacers to form voids that define at least one nanowire of a nanowire FET device.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings.

FIGS. 1-11B are a series of cross-sectional diagrams illustrating a process flow of fabricating a nanowire FET device according to a non-limiting embodiment, in which:

FIG. 1 is a first orientation of a starting semiconductor-on-insulator (SOI) wafer including a buried oxide (BOX) layer interposed between a bulk layer and an active SOI stack layer including an alternating series of sacrificial layers and active semiconductor layers;

FIG. 11B illustrates the SOI wafer of FIG. 11A in the third orientation.

DETAILED DESCRIPTION

As described herein, various embodiments provide gate-all-around nanowire field effect transistors (FETs) including oxidized spacers surrounding a respective metal gate electrode. The oxidized spacers are precisely located to isolate the metal gate electrode from respective source/drain regions of the nanowire FET. According to an embodiment, a method is provided that includes forming one or more stacked multi-layer semiconductor fins comprising a series of semiconductor fin portions and sacrificial fin portions. A selective oxidation process is then performed that forms oxidized spacers on sidewalls of the sacrificial fin portions. A replacement metal gate process is subsequently performed that forms a replacement metal gate resulting in a nanowire FET having source/drain regions that are self-aligned with the metal gate electrode.

Figure 1:
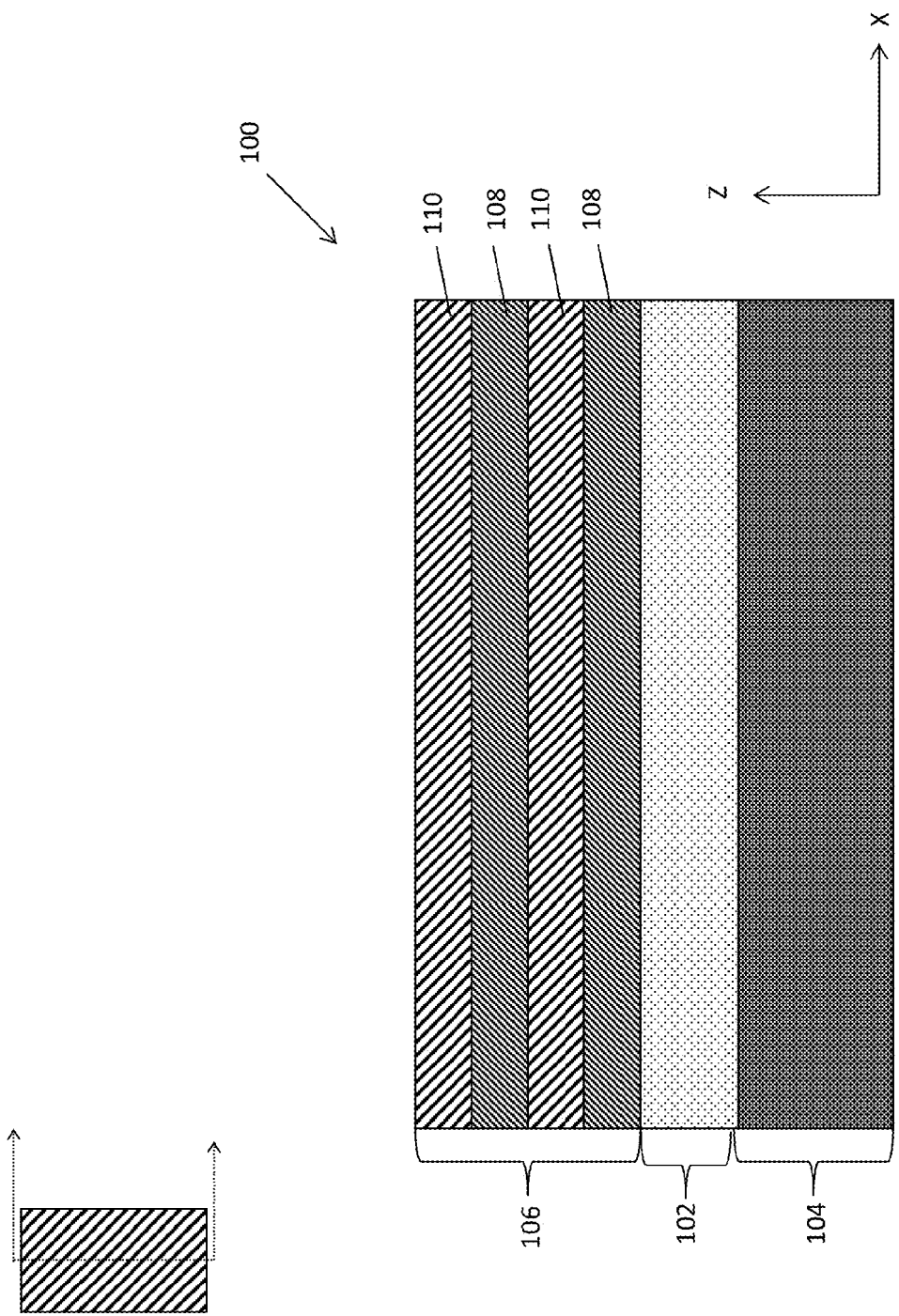

A non-limiting nanowire FET fabrication process flow is described by way of a reference to FIGS. 1-11B. As shown in FIG. 1, a starting wafer 100 extends along a first axis (X-axis) to define a length and a second axis (Z-axis) perpendicular the first axis to define a height (i.e., vertical thickness). Although not illustrated in FIG. 1, the wafer 100 also extends along a third axis (e.g., Y-axis) to define a width. According to a non-limiting embodiment, the starting wafer 100 is constructed as a semiconductor-on-insulator (SOI) wafer 100. The SOI wafer 100 includes a buried oxide (BOX) layer 102 interposed between a bulk layer 104 and a SOI layer 106. The bulk layer 104 is formed from, for example, silicon (Si), and the BOX layer 102 is formed from, for example, silicon oxide ($SiO_2$). The BOX layer 102 has vertical thickness ranging from approximately 25 nanometers (nm) to approximately 500 nm.

The SOI layer 106 is formed as a stack including an alternating series of sacrificial layers 108 and active semiconductor layers 110 on the bulk layer 104. Although four layers are illustrated, it should be appreciated that the SOI stack 106 can include any number (n) of layers. In this manner, a first sacrificial layer 108 is formed directly on an upper surface of the BOX layer 102, and a first active semiconductor layer 110 is formed on an upper surface of the first sacrificial layer 108. The sacrificial layers 108 have a vertical thickness ranging, for example, from approximately 3 nm to approximately 20 nm. The active semiconductor layers 110 have a vertical thickness ranging, for example, from approximately 3 nm to approximately 20 nm.

The sacrificial layers 108 are formed of a first semiconductor material and the active semiconductor layers 110 are formed of a second semiconductor material different from the first semiconductor material. For example, the sacrificial layers 108 are formed from silicon germanium (SiGe), while the active semiconductor layers 110 are formed from silicon (Si). According to another example, the sacrificial layers 108 are formed from Si, while the active semiconductor layers 110 are formed from SiGe.

Multiple epitaxial growth processes can be performed to form the sacrificial layers 108 and the active semiconductor layers 110. To achieve a SiGe sacrificial layer 108 directly on the upper surface of the BOX layer 102, for example, a SiGe layer is first epitaxially grown on an upper surface of an initial SOI layer (not shown). Thereafter, the SiGe layer is condensed using a thermal oxidation process, for example, that results in the Si in the SiGe layer being consumed (by the oxidation process) while the Ge is driven down into the initial SOI layer (not shown). The thermal oxidation process includes, for example, exposing the initial SiGe layer to a temperature of from about 900° Celsius (C) to about 1,200° C., e.g., about 1,100° C. for a duration from about 5 minutes to about 15 minutes, in $O_2$. In this manner, a single initial SiGe layer 108 is formed on an upper surface of the BOX layer 102 as illustrated in FIG. 1. Subsequent to forming the initial SiGe layer 108, a first active semiconductor layer 110 is epitaxially grown on an upper surface of the initial SiGe layer 108. Thereafter, additional epitaxial growth processes can be performed to form the SOI layer 106 as a stack including an alternating series of sacrificial layers 108 and active semiconductor layers 110 as further illustrated in FIG. 1. It should be appreciated that the alternating series of sacrificial layers 108 and active semiconductor layers 110 can be either relaxed or strained. For example, if grown to a certain thickness or with a low Ge concentration, the layers 108/110 will be relaxed due to dislocation defects. However, increasing the concentration of Ge, for example, may strain the alternating series of sacrificial layers 108 and active semiconductor layers 110.

Figure 2A:
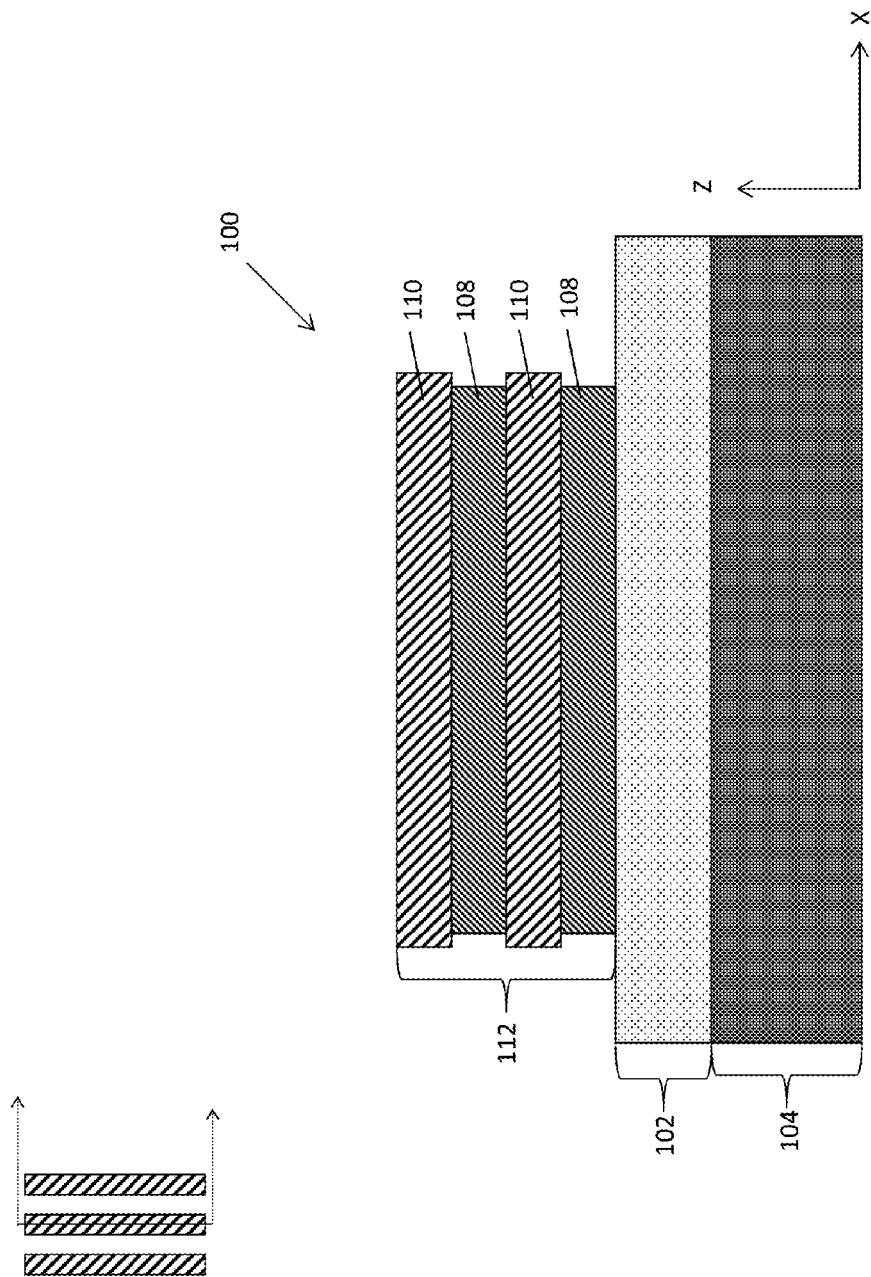
FIG. 2A illustrates the SOI wafer of FIG. 1 following a fin patterning process to pattern the active SOI layer and form stacked multi-semiconductor layer fins including an alternating series of sacrificial fin portions and active fin portions.
Figure 2B:
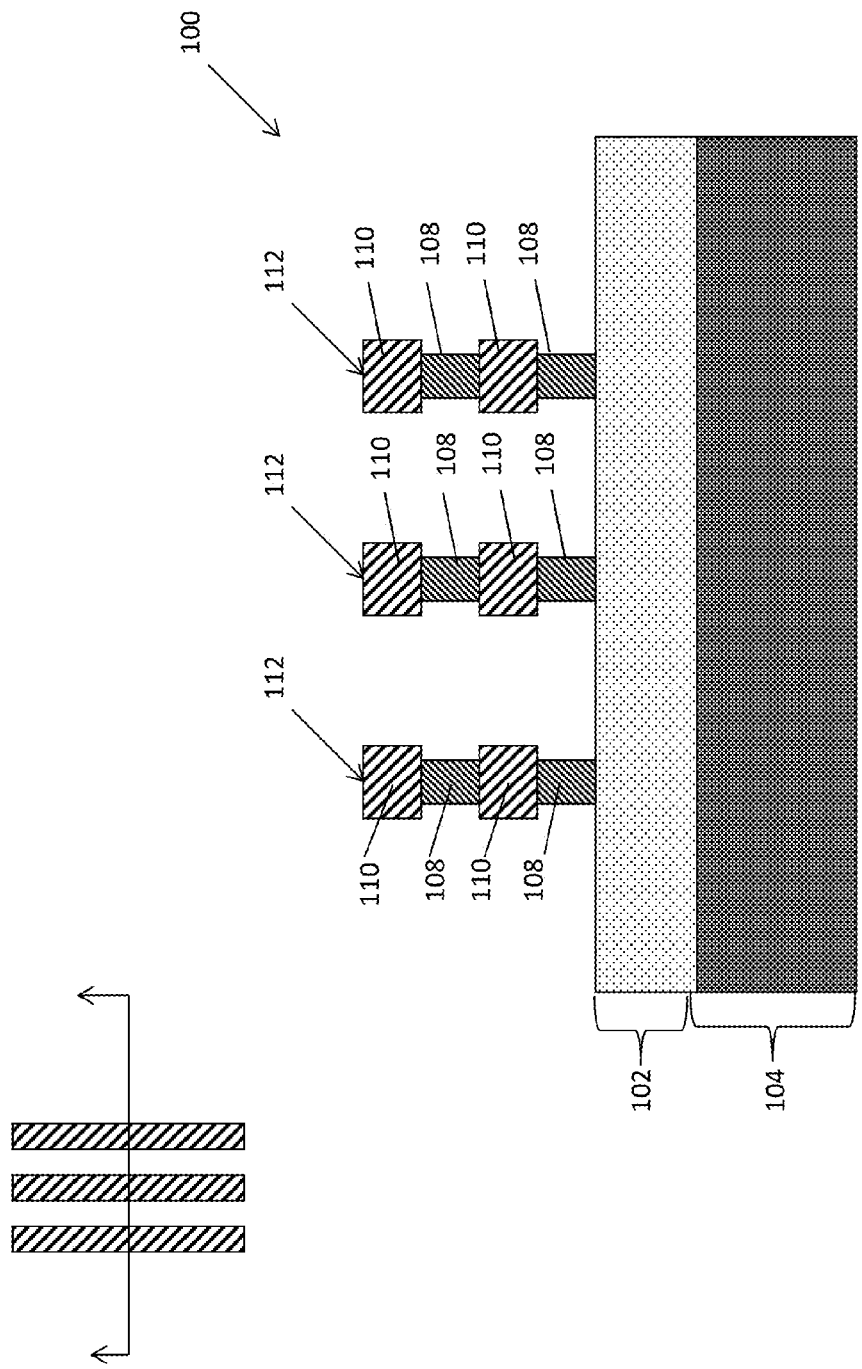
FIG. 2B illustrates the SOI wafer of FIG. 2A in a second orientation.

Turning now to FIGS. 2A-2B, the starting wafer 100 is illustrated following a fin patterning process to pattern one or more stacked multi-semiconductor layer fins 112 on an upper surface of the BOX layer 102. The stacked multi-semiconductor layer fins 112 include at one or more active semiconductor fin portions 110 (i.e., active fin portions 110) interposed between an opposing pair of sacrificial fin portions 108. A standard sidewall image transfer (SIT) process utilizing a patterned fin hardmask (not shown) formed on an upper surface of the upper-most active semiconductor layer 110 can be performed to form the stacked multi-semiconductor layer fins 112 as understood by one of ordinary skill in the art. Although three stacked multi-semiconductor layer fins 112 are shown, it should be appreciated that more or less stacked multi-semiconductor layer fins 112 can be formed.

By way of example only, fin hardmasks (not shown) can be configured to have a pitch, i.e., a spatial frequency, of less than about 200 nm, for example, from about 10 nm to about 200 nm, with a preferred range of about 40 nm to about 50 nm, for example. To maximize layout density and minimize parasitic capacitance, the pitch should be as small as possible within patterning and processing limits. To achieve pitches smaller than what can be defined by direct lithography, a pitch doubling technique such as a double patterning/double etching process, for example, can be used. According to an exemplary embodiment, a width of each fin hardmask can rage, for example, from about 5 nm to about 40 nm. The pitch/width of each fin hardmask determines a pitch/width of each nanowire (not shown in FIGS. 2A-2B).

Thus, based on the pitch and width of the fin hardmasks, the resulting fins 112 are formed with a pitch, i.e., a spatial frequency, from about 10 nm to about 200 nm, e.g., with a preferred range of about 40 nm to about 50 nm, for example, and a width of less than about 40 nm, with a preferred range from about 5 nm to about 10 nm, for example.

Further, the sacrificial fin portion 108 (e.g., the SiGe layer 108) may be thinner than the active fin portion 110 (e.g., the Si layer 110) following the fin etch. This is the result of the sacrificial fin layer 108 being etched laterally during the fin etch process. It should be appreciated, however, that other etching processes may allow the sacrificial fin portion 108 to be flush or approximately flush with the active fin portion 110 following the fin etch.

Figure 3A:
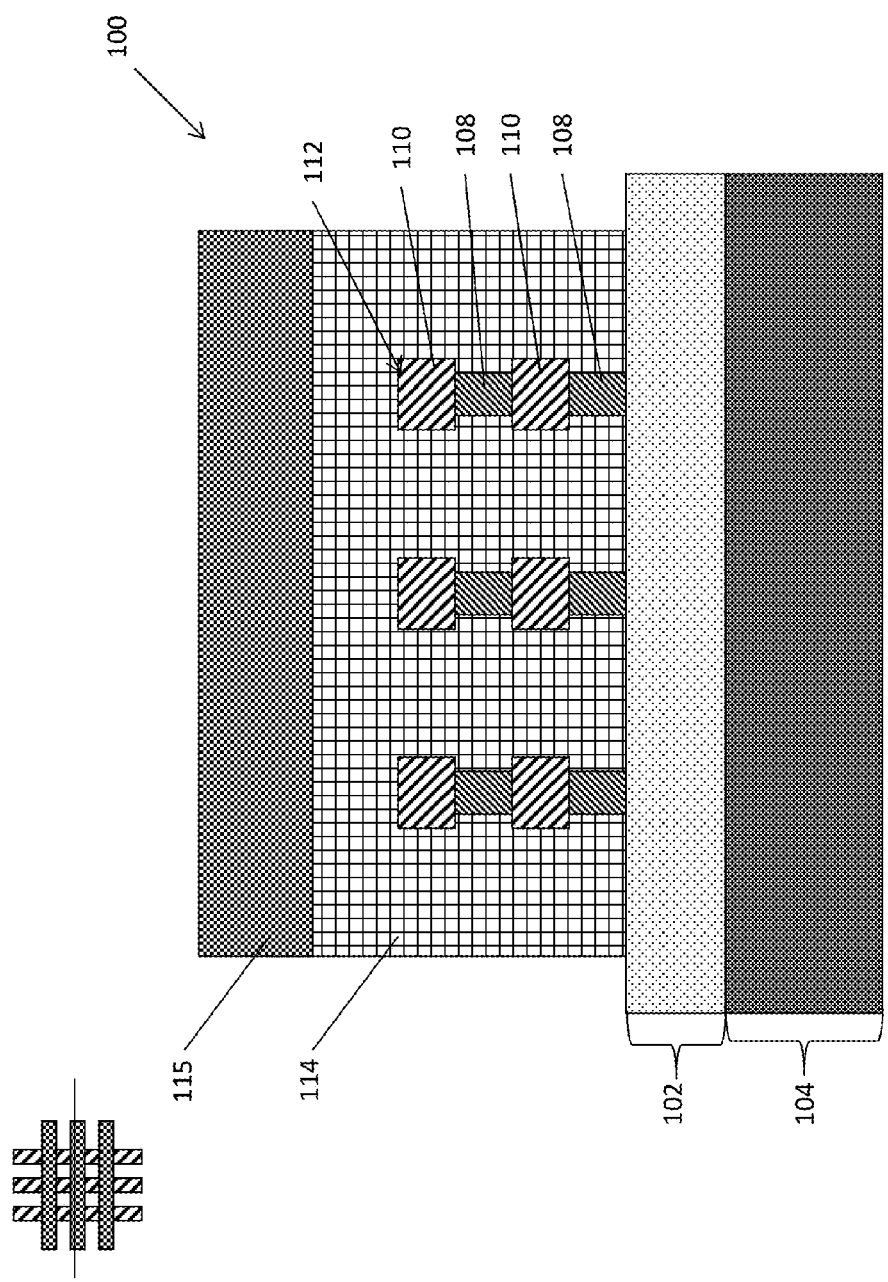
FIG. 3A illustrates the SOI wafer of FIGS. 2A-2B in the first orientation following formation of dummy gates that surrounding the fins.
Figure 3B:
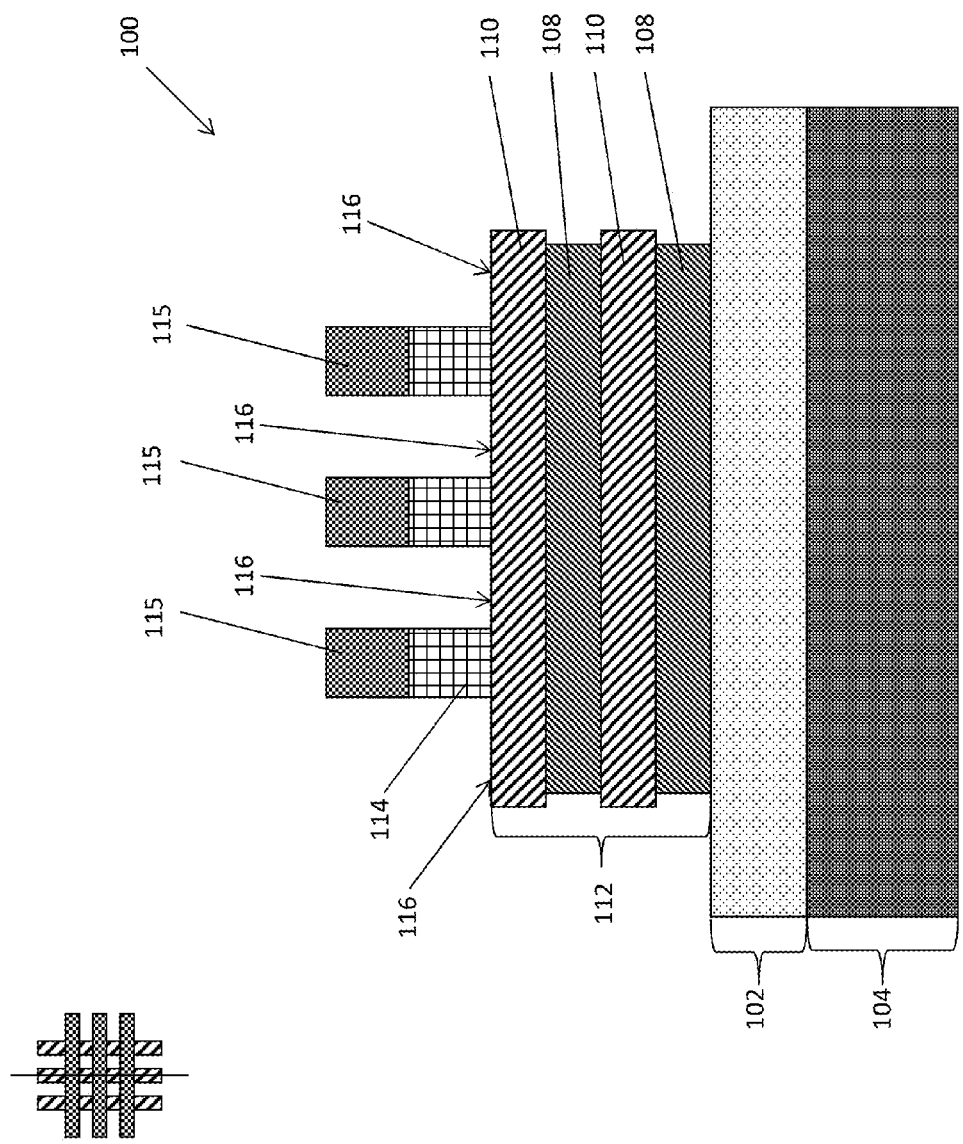
FIG. 3B illustrates the SOI wafer of FIG. 3A in the second orientation.
Figure 3C:
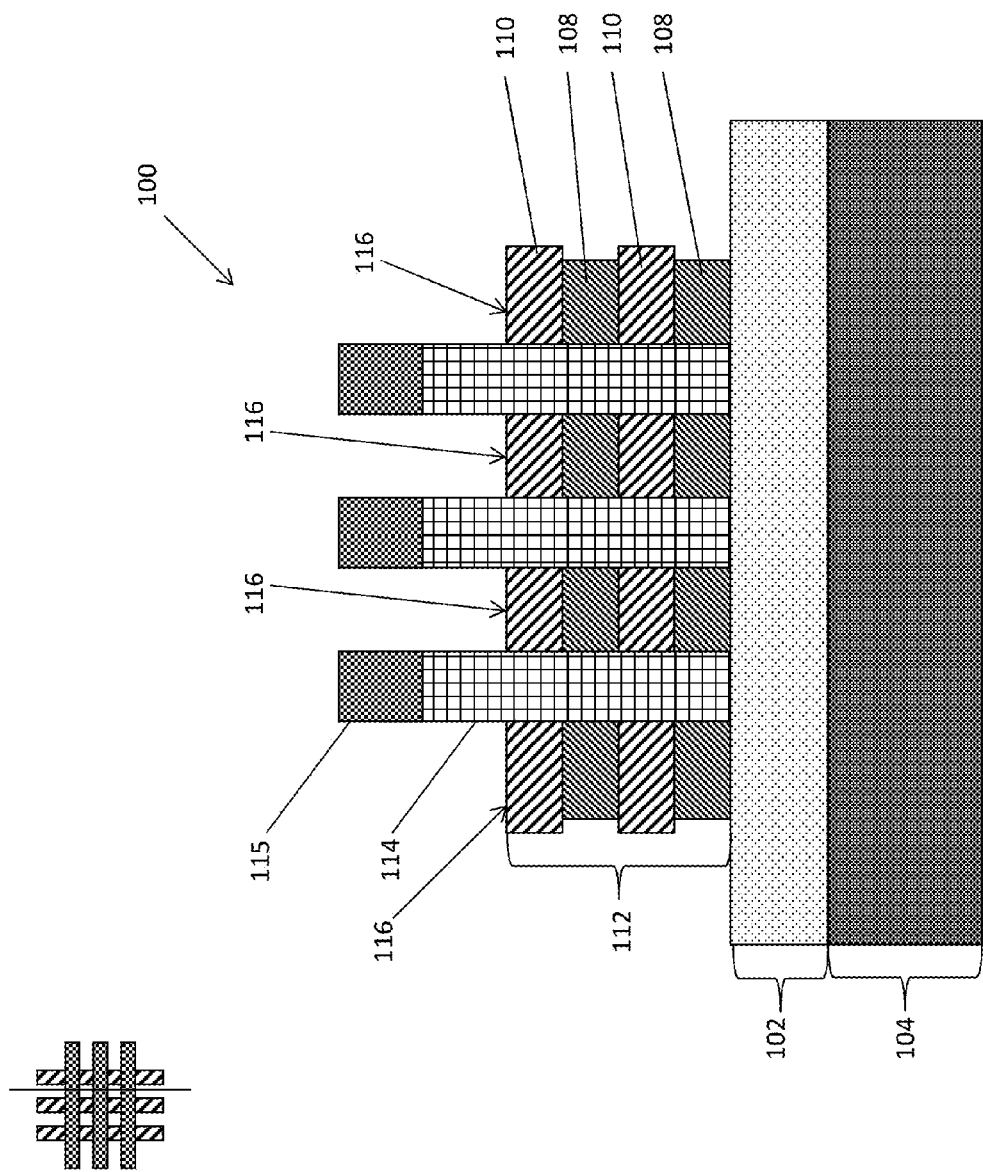
FIG. 3C illustrates the SOI wafer of FIGS. 3A-3B in a third orientation.

Referring now to FIGS. 3A-3C, one or more dummy gates 114 are formed surrounding the fins 112. The dummy gates 114 are formed using various masking and etching process understood by one of ordinary skill in the art. For example, a dummy gate material (not shown) such as poly-silicon, for example, is first blanket deposited onto the wafer 100 using a low-pressure chemical vapor deposition (LPCVD) process to cover the fins 112. Prior to depositing the dummy gate material, an oxide layer may be formed on the exposed surfaces of the fins 112. The oxide layer may be formed on the fins 112 using thermal oxidation, for example, and may have a thickness ranging, for example, from about 2 nm to about 4 nm. The oxide layer is formed to provide an etch stop layer for the dummy gate removal process as understood by one of ordinary skill in the art. According to an embodiment, sacrificial source/drain (S/D) regions 116 of the fins 112 are defined on opposing sides of the dummy gates 114 as further illustrated in FIGS. 3B-3C.

Gate hardmasks 115 are then formed on an upper surface of the dummy gate material as further illustrated in FIGS. 3A-3C. According to a non-limiting embodiment, the gate hardmasks 115 are formed from a nitride material such as, for example, silicon nitride (SiN). Although not illustrated, it is well-known by one of ordinary skill in the art that the gate hardmasks 115 can be formed by first blanket depositing a hardmask material (not shown) such as SiN, for example, onto the dummy gate material using, for example, chemical vapor deposition (CVD) or plasma etched chemical vapor deposition (PECVD), and then performing a gate patterning process. The patterning of the hardmask material corresponds to a desired location of the gates of the device. As understood by one of ordinary skill in the art, a resist film (not shown) is deposited on the hardmask material and patterned with the footprint and location of each of the gate hardmasks. In one example, RIE is used to form the gate hardmasks 115, and therefore the resist film comprises a resist material combined with an electro-beam (e-beam) lithography process. Next, the gate hardmasks 115 are used to pattern the dummy gate material into a plurality of individual dummy gates 114 as further illustrated in FIGS. 3A-3C. The dummy gates 114 can be patterned using a poly-silicon selective RIE around the gate hardmasks 115 as understood by one of ordinary skill in the art.

Figure 4A:
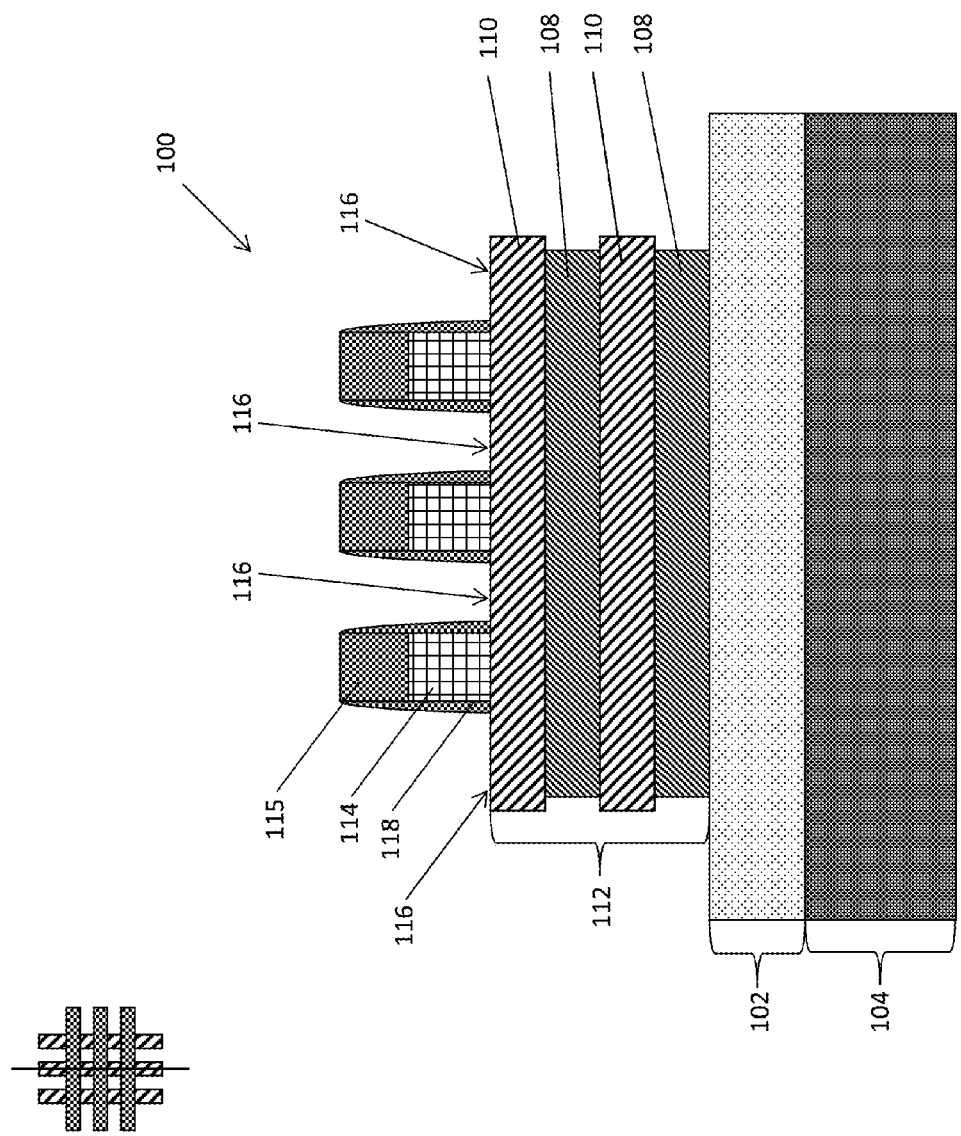
FIG. 4A illustrates the SOI wafer of FIGS. 3A-3C in the first orientation after forming gate spacers on opposing sides of the dummy gates.
Figure 4B:
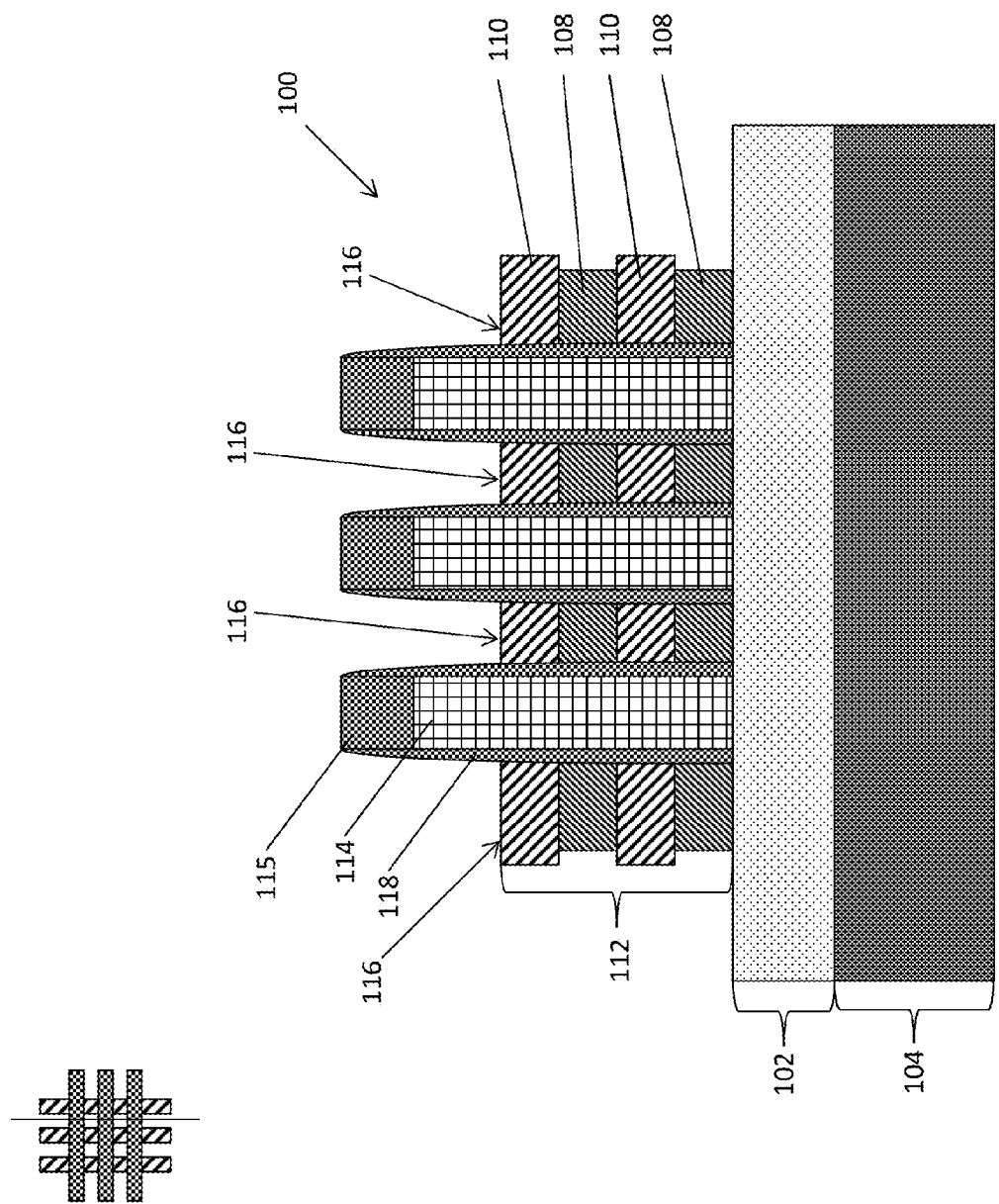
FIG. 4B illustrates the SOI wafer of FIG. 4A in the third orientation.

Referring now to FIGS. 4A-4B, gate spacers 118 are then formed on opposite sides of the dummy gates 114. According to an exemplary embodiment, the gate spacers 118 are formed by first depositing a block nitride layer (not shown) onto the wafer 100 to cover the fins 112. A resist film (not shown) is then deposited on the block nitride layer. The resist film is subsequently masked and patterned with a location and footprint of the gate spacers 118 as understood by one of ordinary skill in the art. A nitride-selective RIE, for example, is then used to transfer the patterned footprint into the nitride layer to form the gate spacers 118. According to a non-limiting embodiment, a chlorine-based RIE process can be used to remove the sacrificial S/D regions 116.

Figure 5A:
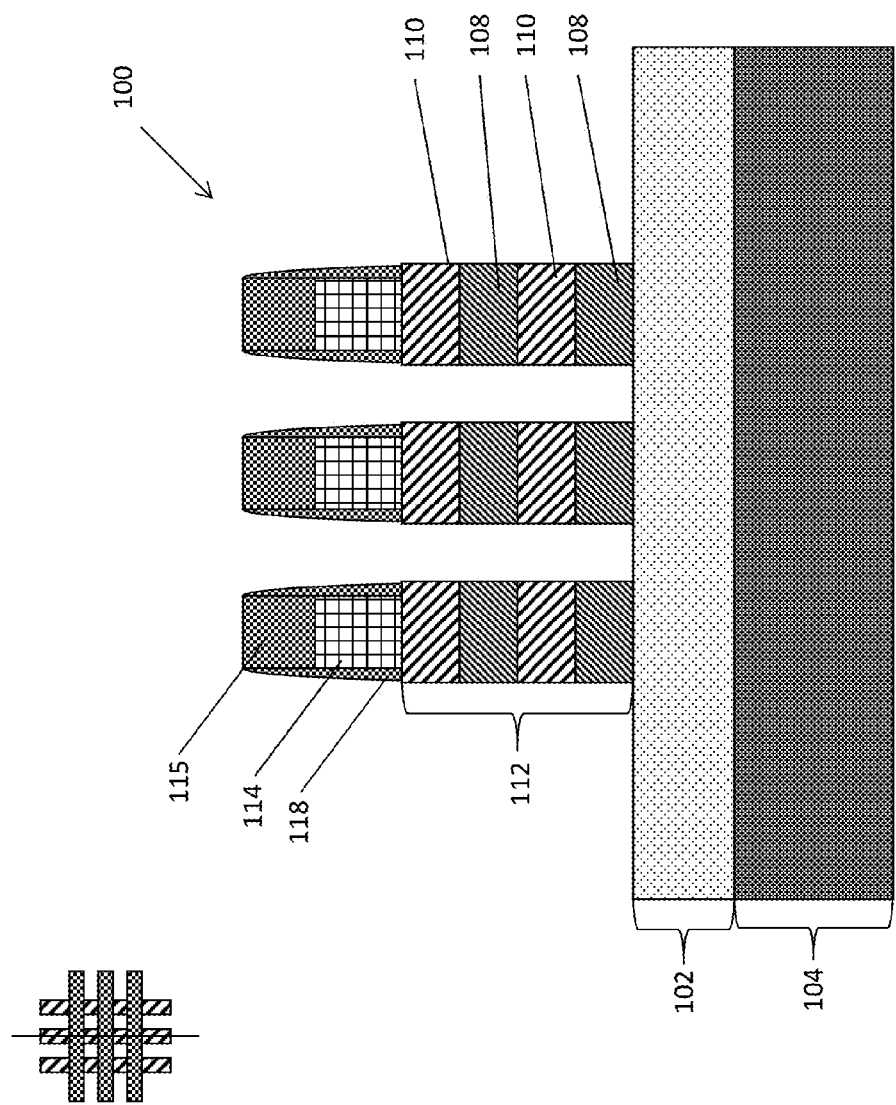
FIG. 5A illustrates the SOI wafer of FIGS. 4A-4B following a selective reactive ion etch (RIE) process to remove sacrificial S/D regions from the fins and expose the underlying BOX layer while maintaining the sacrificial fin portions and the active fin portions located beneath the gate hardmasks and the gate spacers.
Figure 5B:
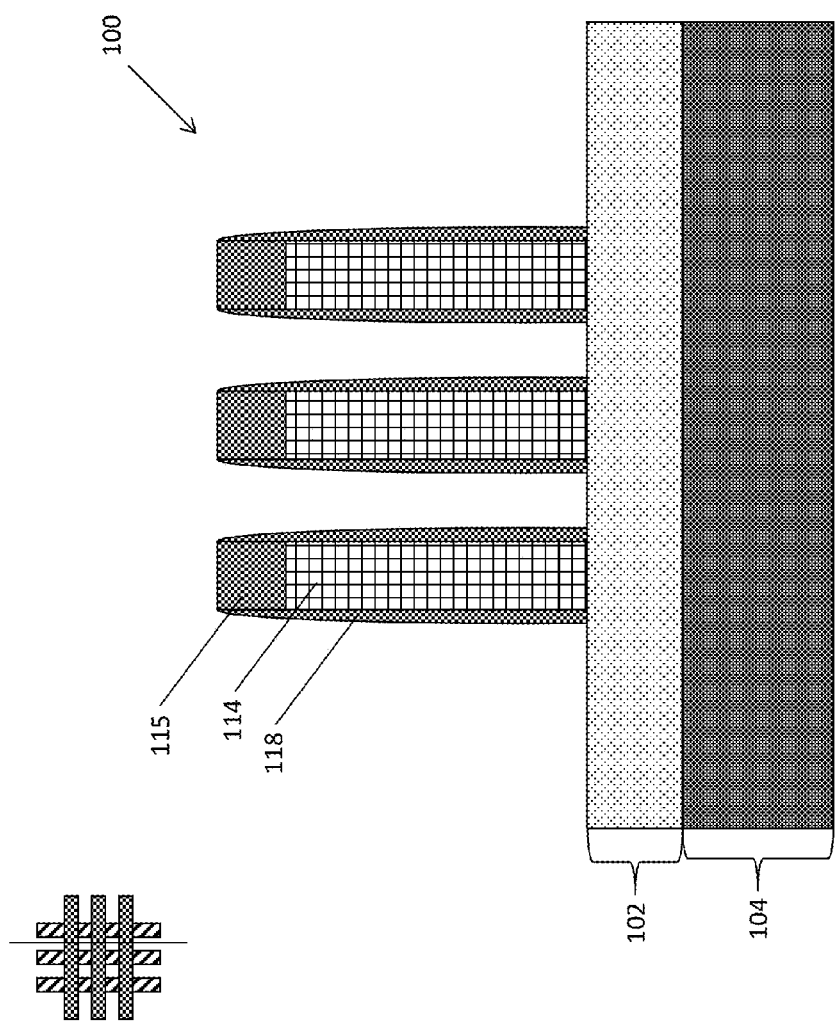
FIG. 5B illustrates the SOI wafer of FIG. 5A in the third orientation.

Turning now to FIGS. 5A-5B, the sacrificial S/D regions 116 are removed from the fins 112. According to an embodiment, a RIE process selective to semiconductor material (e.g., Si and SiGe) is performed to remove the sacrificial S/D regions 116 while the dummy gate stack (e.g., the gate hardmasks 115 and gate spacers 118 formed on the dummy gate 114) serve as a mask to preserve the underlying sacrificial fin portions 108 and the underlying active fin portions 110. In this manner, the upper surface of the wafer (e.g., BOX layer 102) is re-exposed, while the portion of the fins 112 (e.g., the sacrificial fin portions and the active semiconductor portions) located beneath the gate hardmasks 115 and the gate spacers 118 is preserved. Further, removal of the sacrificial S/D regions 116 allows access to the sidewalls of the underlying sacrificial fin portions 108 and the underlying active fin portions 110.

Figure 6A:
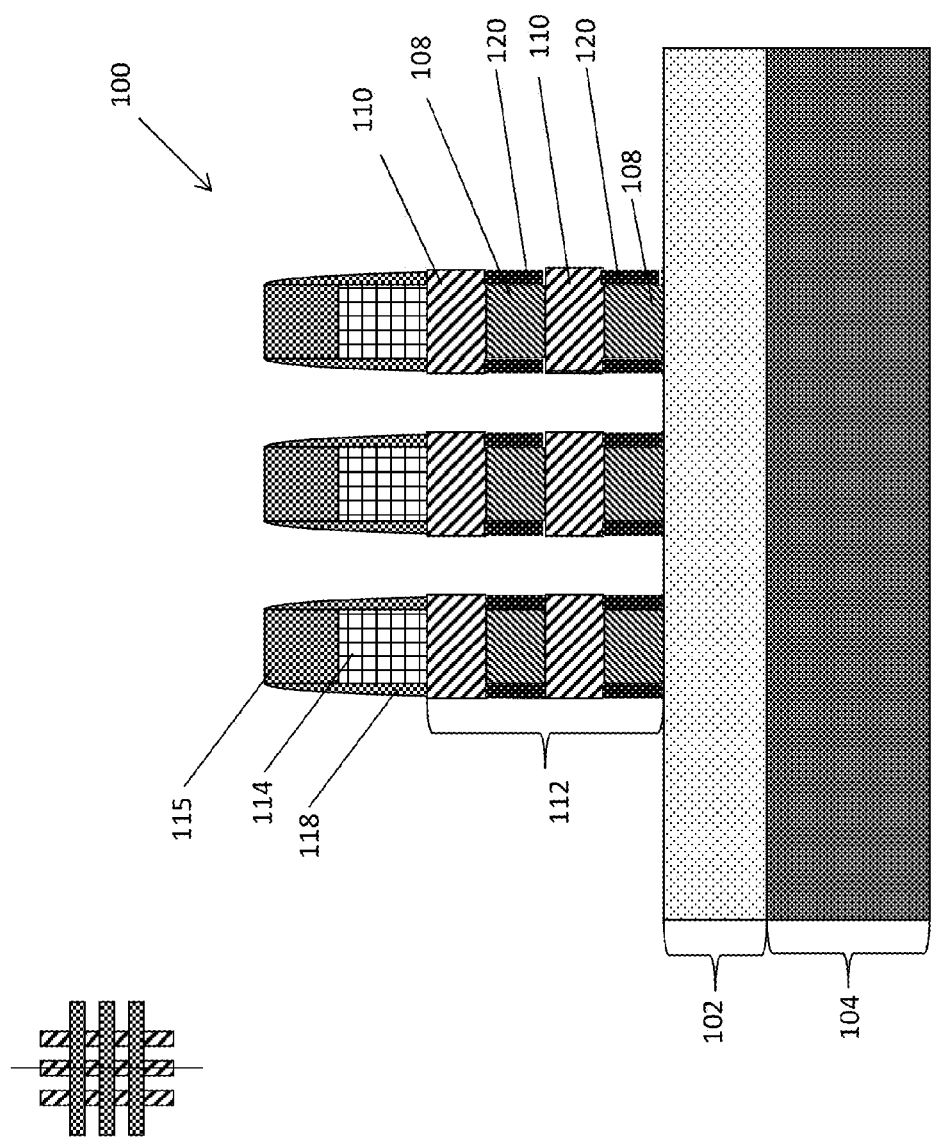
FIG. 6A illustrates the SOI wafer of FIGS. 5A-5B in the first orientation following a selective oxidation process to form oxidized spacers on sidewalls of the sacrificial fin portions.
Figure 6B:
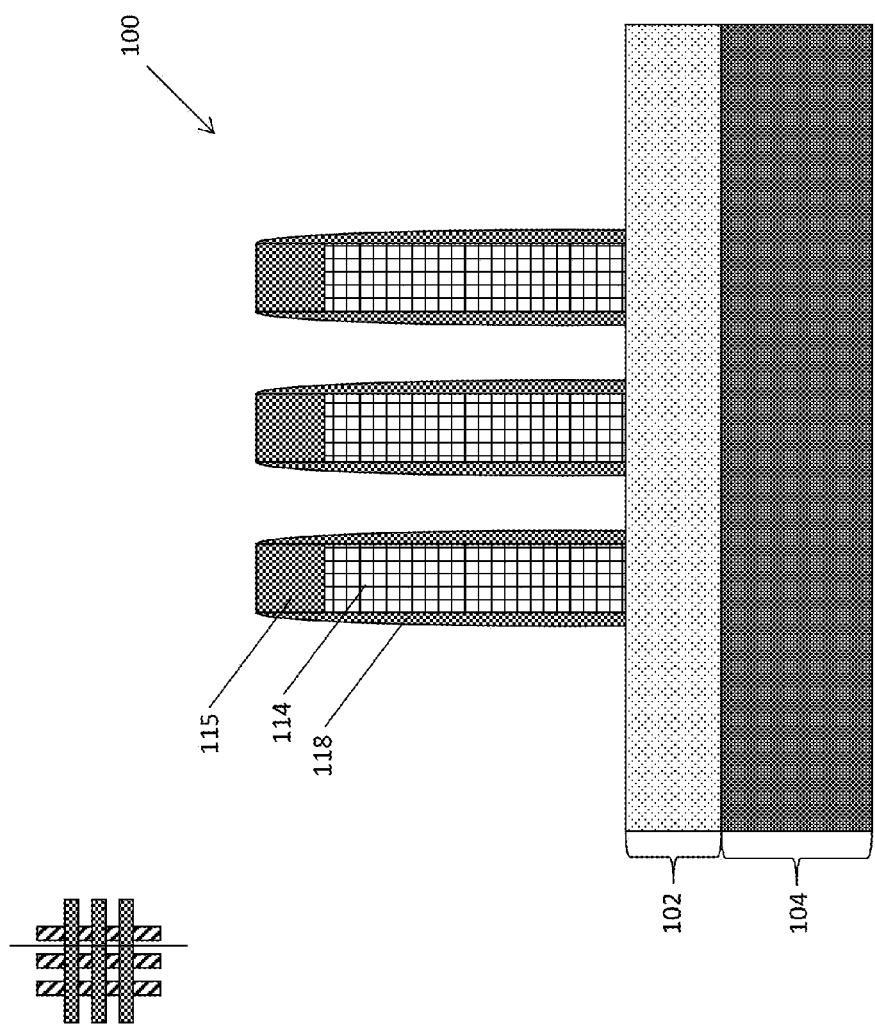
FIG. 6B illustrates the SOI wafer of FIG. 6B in the third orientation.

Referring to FIGS. 6A-6B, the wafer 100 is illustrated after performing a selective oxidation process to form oxidized spacers 120 on sidewalls of the sacrificial fin portions. The oxide spacers 120 may serve as a stopping layer when etching away the sacrificial fin portions from the fins 112 to release the nanowires (not shown in FIGS. 6A-6B) as discussed in greater detail below. That is, the direction of the etch used to remove the sacrificial fin portions is contained beneath the active semiconductor portions and is stopped from extending laterally beyond the oxide spacers 120.

The selective oxidation process to form the oxide spacers 120 may include, for example, a selective wet oxidation or selective dry oxidation. If a selective wet oxidation process is desired, a high-pressure steam oxidation process can be performed. The high-pressure steam oxidation includes performing the oxidation above an atmospheric pressure in a combined $H_2O$/N-based environment at relatively low temperatures ranging, for example, from 500 degrees Celsius (° C.) to 700° C. If a selective dry oxidation process is desired, a oxidation can be performed at atmospheric pressure, e.g., approximately 10,1325 pascals (Pa) (e.g., in an $O_2$ or $O_2/N_2$ based environment at temperatures ranging, for example, from approximately 600° C. to approximately 800° C.

The selective oxidation process can be time-based such that oxide spacers 120 having a desired thickness can be achieved. The thickness of the oxide spacers 120 can range, for example, from approximately 5 nm to approximately 7 nm. Additional etching processes can be performed to remove excess oxidation material from sidewalls of the active semiconductor portion (e.g., the Si portion). Accordingly, the oxide spacers 120 are formed having a thickness that is equal, or approximately equal, to a thickness of the gate spacers 118, e.g., approximately 5 nm.

Figure 7A:
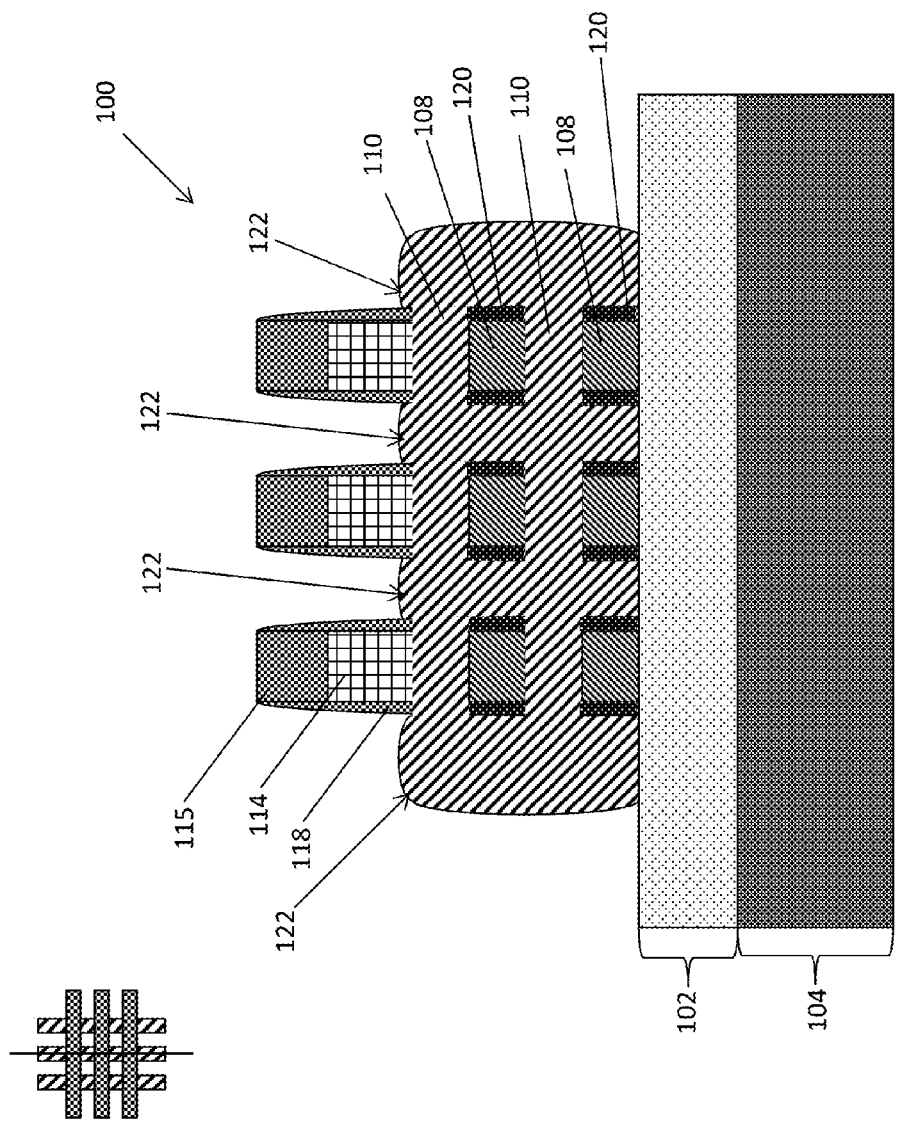
FIG. 7A illustrates the SOI wafer of FIGS. 6A-6B in the first orientation after an epitaxial growth process is performed to form replacement S/D regions at locations previously occupied by the sacrificial S/D regions.
Figure 7B:
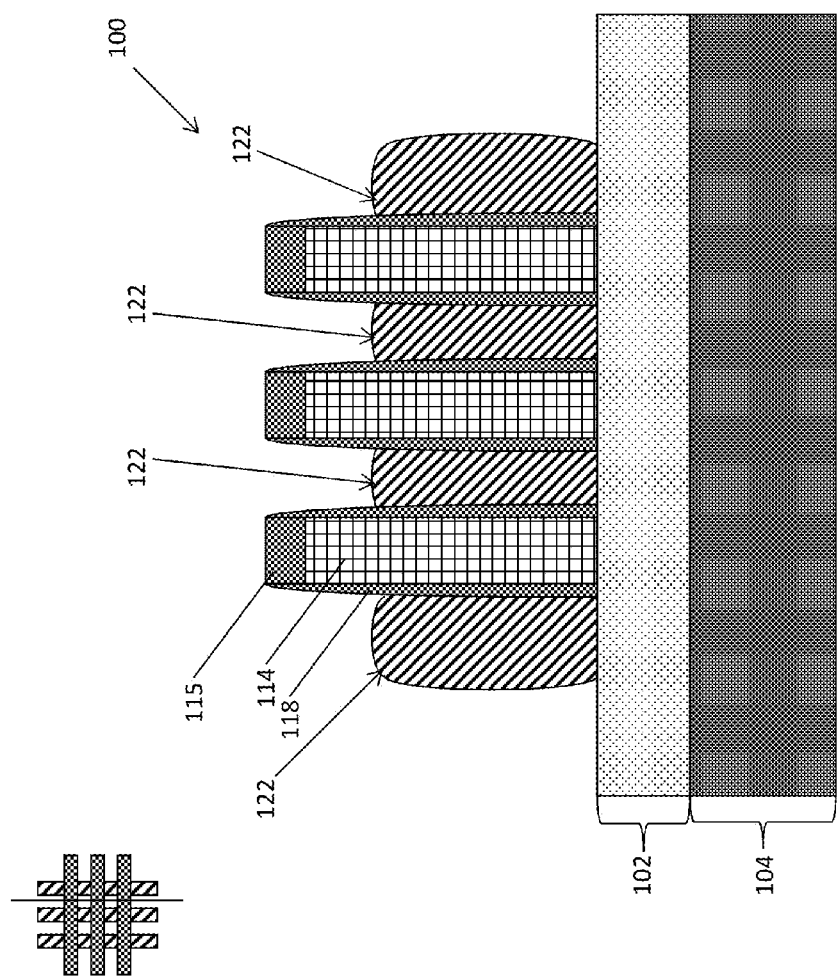
FIG. 7B illustrates the SOI wafer of FIG. 7A in the third orientation.

Turning now to FIGS. 7A-7B, an epitaxial growth process is performed to form replacement S/D regions 122 at locations previously occupied by the sacrificial S/D regions 116. The replacement S/D regions 122 are grown from sidewalls of the active semiconductor portions (e.g., the Si portions) of the remaining fins 112. In this manner, the epitaxial material grows laterally until merging together, thereby forming the raised replacement S/D regions 122 having gate channel regions (i.e., the active semiconductor portions) formed therebetween as shown in FIGS. 7A-7B. According to a non-limiting embodiment, the replacement S/D regions 122 are an in-situ doped epitaxially grown semiconductor material. When forming a NFET device, the replacement source/drain regions comprise, for example, silicon (Si) doped with phosphorous (P). When forming a PFET device, the replacement source/drain regions 122 comprise, for example, silicon germanium (SiGe) doped with boron (B). The epitaxy process used to form the replacement source and drain regions 122 may be carried out using vapor phase epitaxy (VPE), molecular beam epitaxy (MBE) or liquid phase epitaxy (LPE) with a gaseous or liquid precursor, such as, for example, silicon tetrachloride.

Figure 8A:
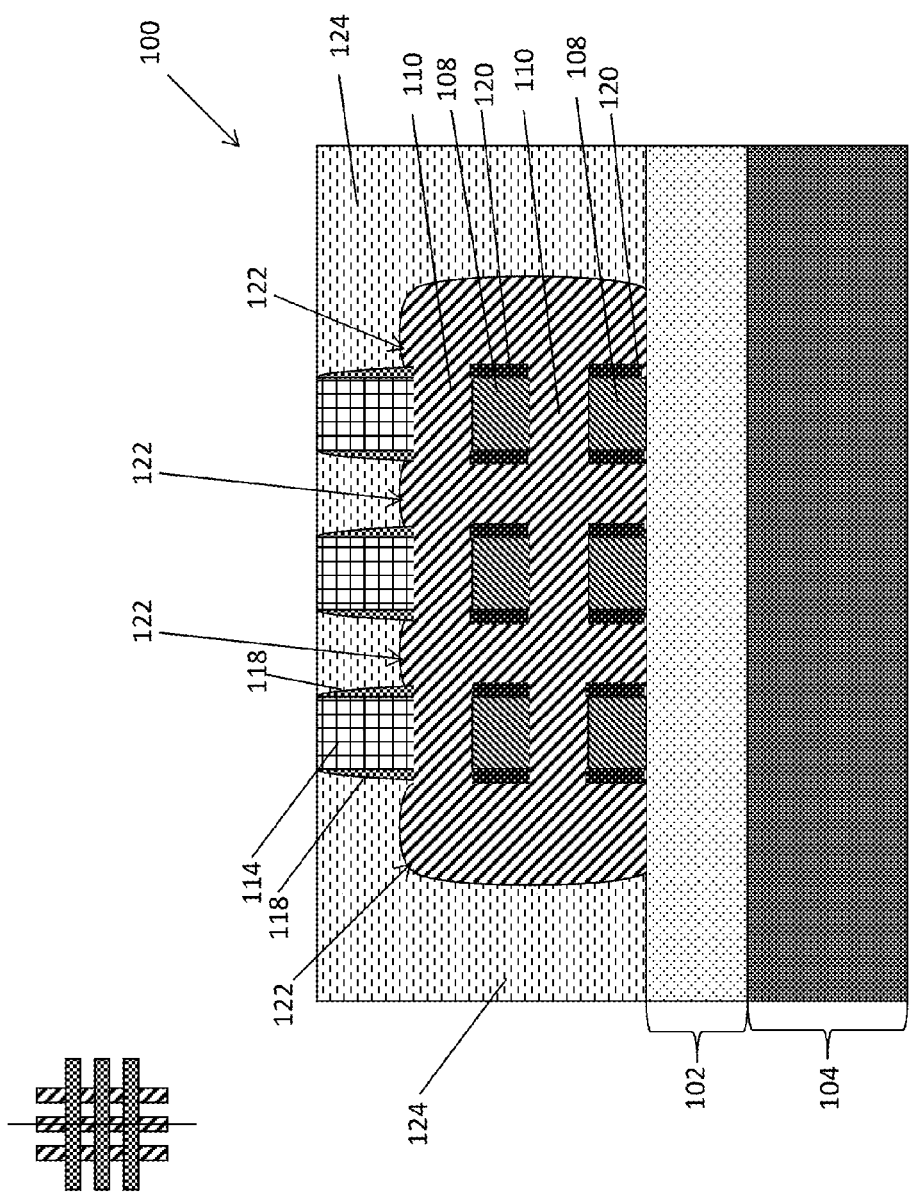
FIG. 8A illustrates the SOI wafer of FIGS. 7A-7B in the first orientation after depositing an interlayer dielectric (ILD) material to fill the spaces between the fins and between the dummy gates.
Figure 8B:
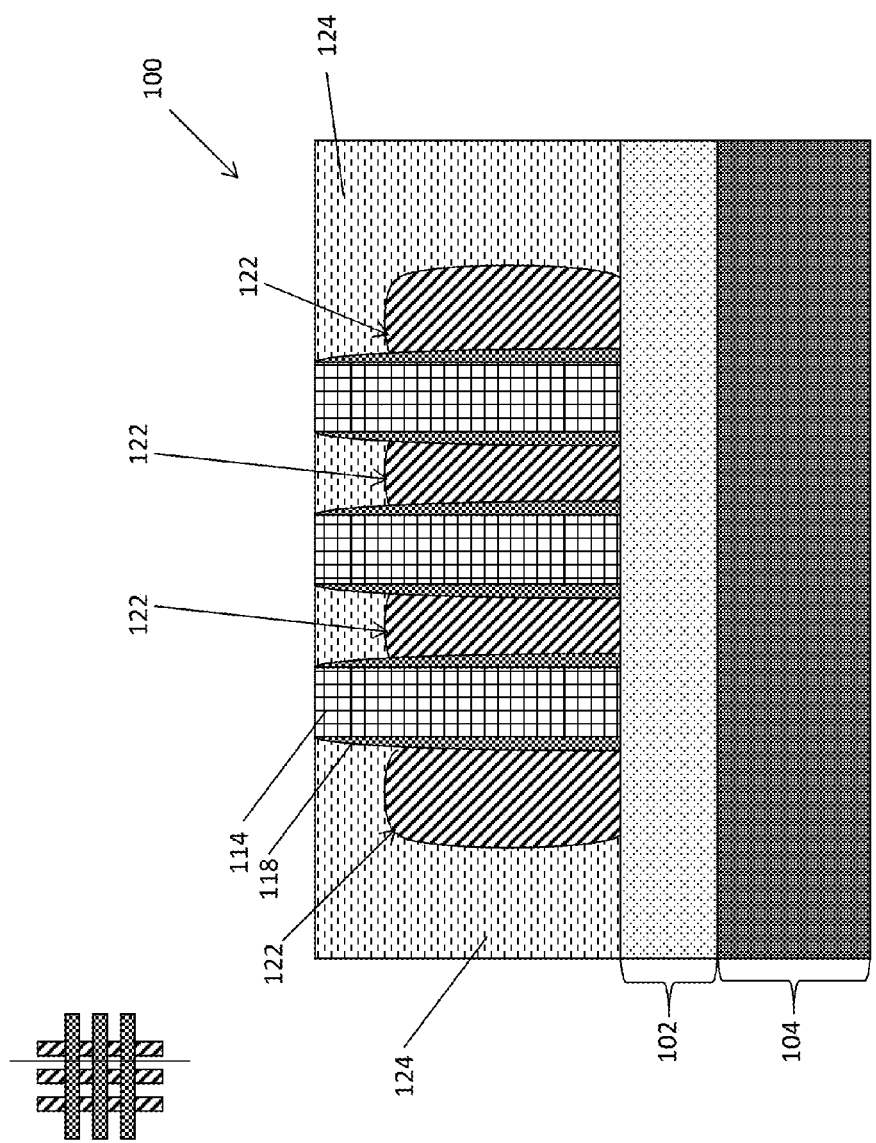
FIG. 8B illustrates the SOI wafer of FIG. 8A in the third orientation.

Referring now to FIGS. 8A-8B, an interlayer dielectric (ILD) material 124 is deposited onto the wafer 100, filling the spaces between the fins 112 and between the dummy gates 114. The ILD material 124 may include any suitable dielectric material such as, for example, silicon dioxide ($SiO_2$). According to an exemplary embodiment, the ILD material 124 is deposited using a high-density plasma (HDP). A chemical mechanical planarization (CMP) process is then used to planarize the ILD material 124. The dummy gates 114 may be used as an etch stop such that any remaining gate hardmasks 115 are removed, and the upper surface of the ILD material 124 is flush with the upper surface of the dummy gates 114 as further illustrated in FIGS. 8A-8B.

Figure 9A:
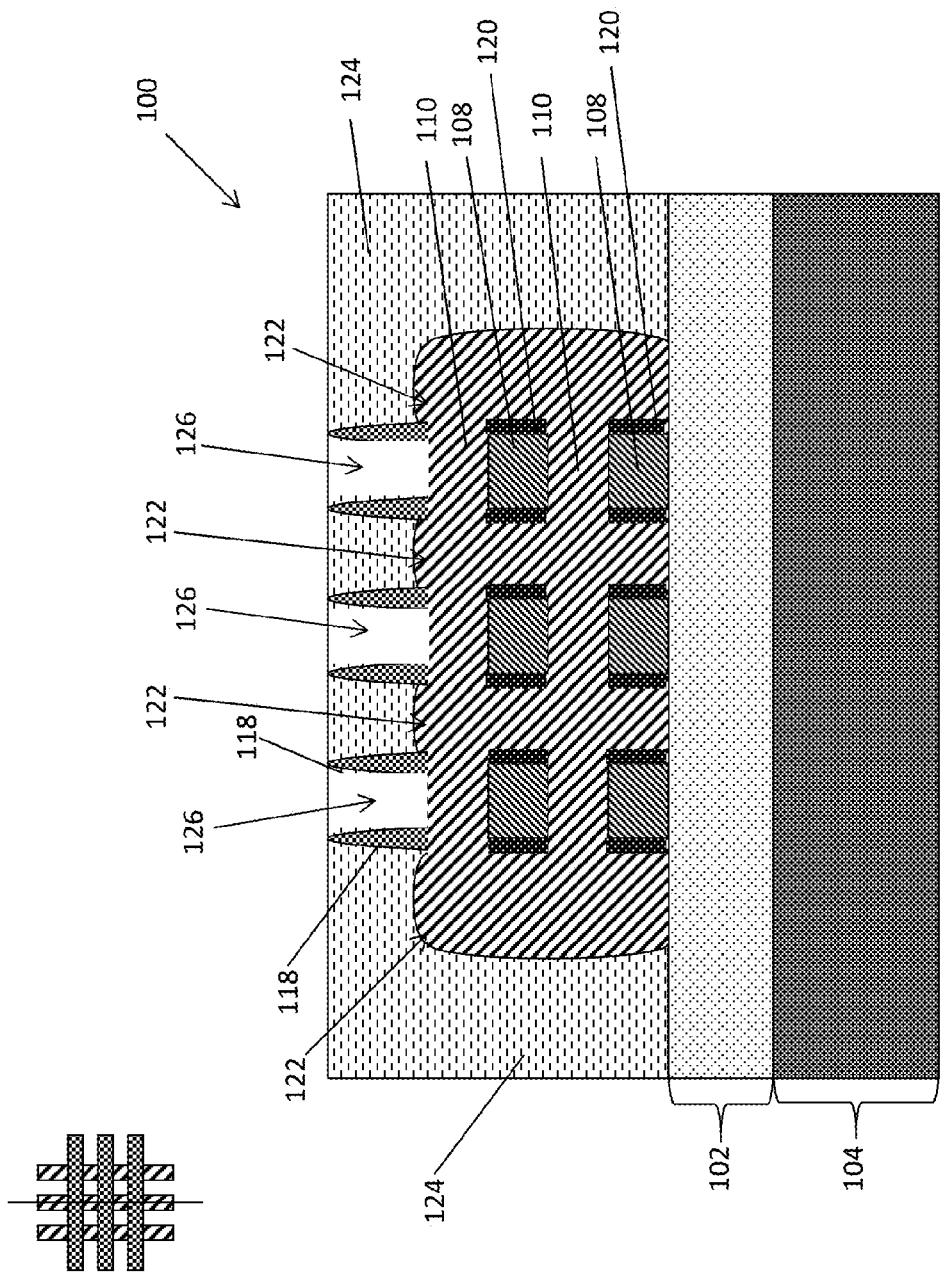
FIG. 9A illustrates the SOI wafer of FIGS. 8A-8B in the first orientation after selectively removing the dummy gates to form trenches in the ILD material which define a nanowire channel region between the replacement S/D regions.
Figure 9B:
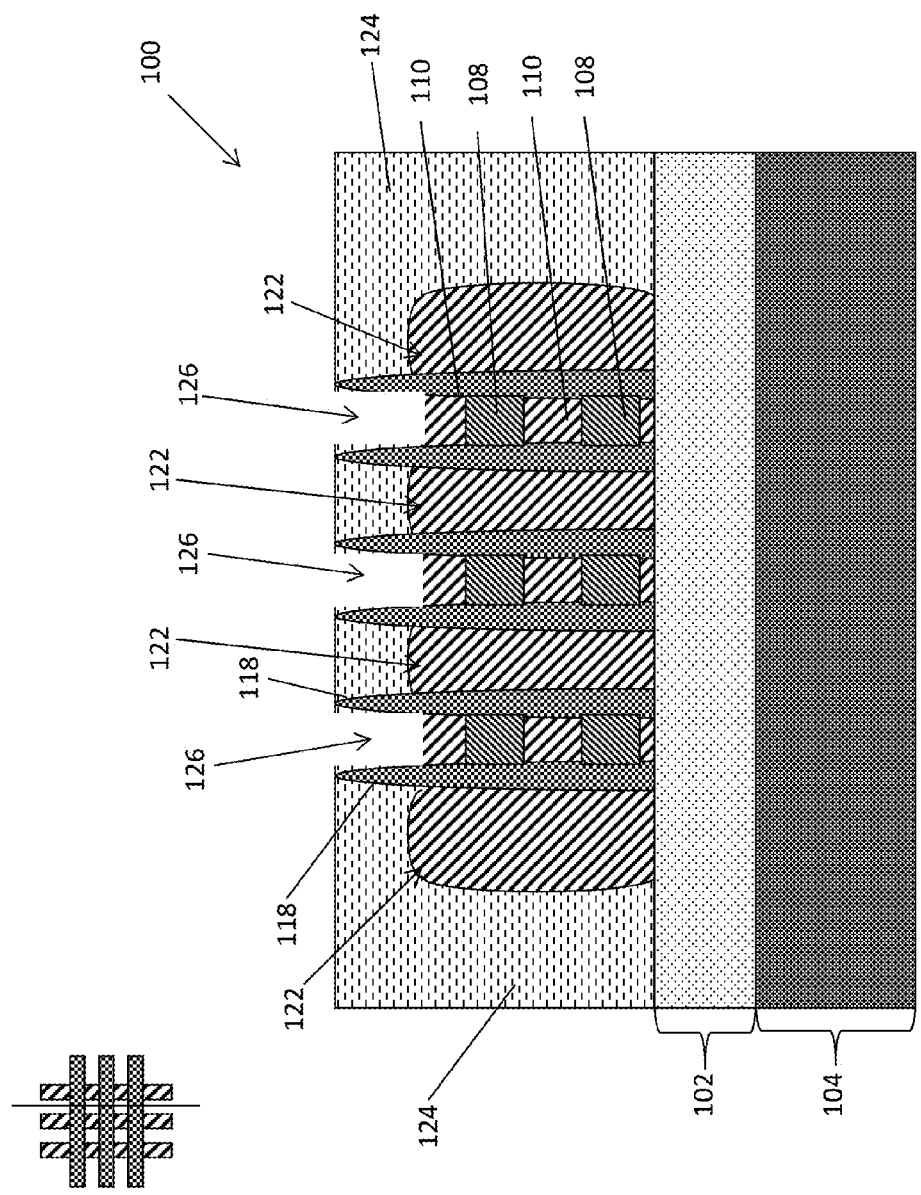
FIG. 9B illustrates the SOI wafer of FIG. 9B in the third orientation.

Referring to FIGS. 9A-9B, the dummy gates 114 are then removed following an etching process that is selective to the gate spacers 120 and the ILD material 124. According to a non-limiting embodiment, the dummy gates 114 are removed using a chemical etching process such as, for example, potassium hydroxide (KOH) etching, or RIE. Accordingly, removal of the dummy gates 114 results in a respective trench 126 being formed in the ILD material 124. According to an exemplary embodiment, each trench 126 defines a nanowire channel region 128 between the replacement S/D regions 122. As mentioned above, in order to form a gate electrode (e.g., a replacement gate described below) that surrounds the nanowire channels 128, the nanowire channels 128 have to be released from the fins 112. Namely, the sacrificial fin portion 108 is removed from the fin 112, resulting in a suspended nanowire (not shown in FIGS. 9A-9B). In such a case, multiple layers of suspended nanowire channels would be formed in this step. These multiple layers of nanowire channels are commonly referred to as a nanowire "mesh."

Figure 10A:
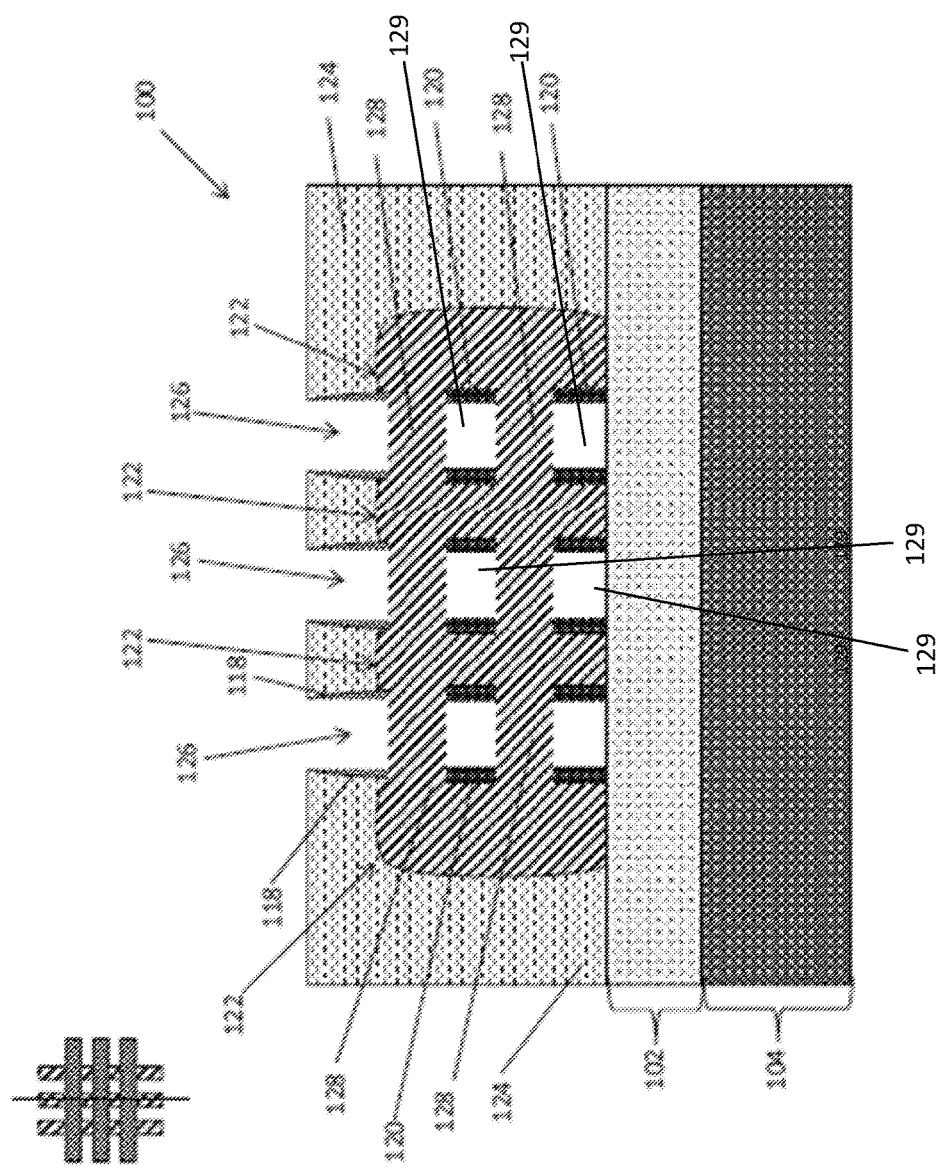
FIG. 10A illustrates the SOI wafer of FIGS. 9A-9B in the first orientation after performing a selective etching process that removes the sacrificial fin portions and stops at the oxidized spacers to define suspended nanowires that are anchored to the replacement S/D regions.
Figure 10B:
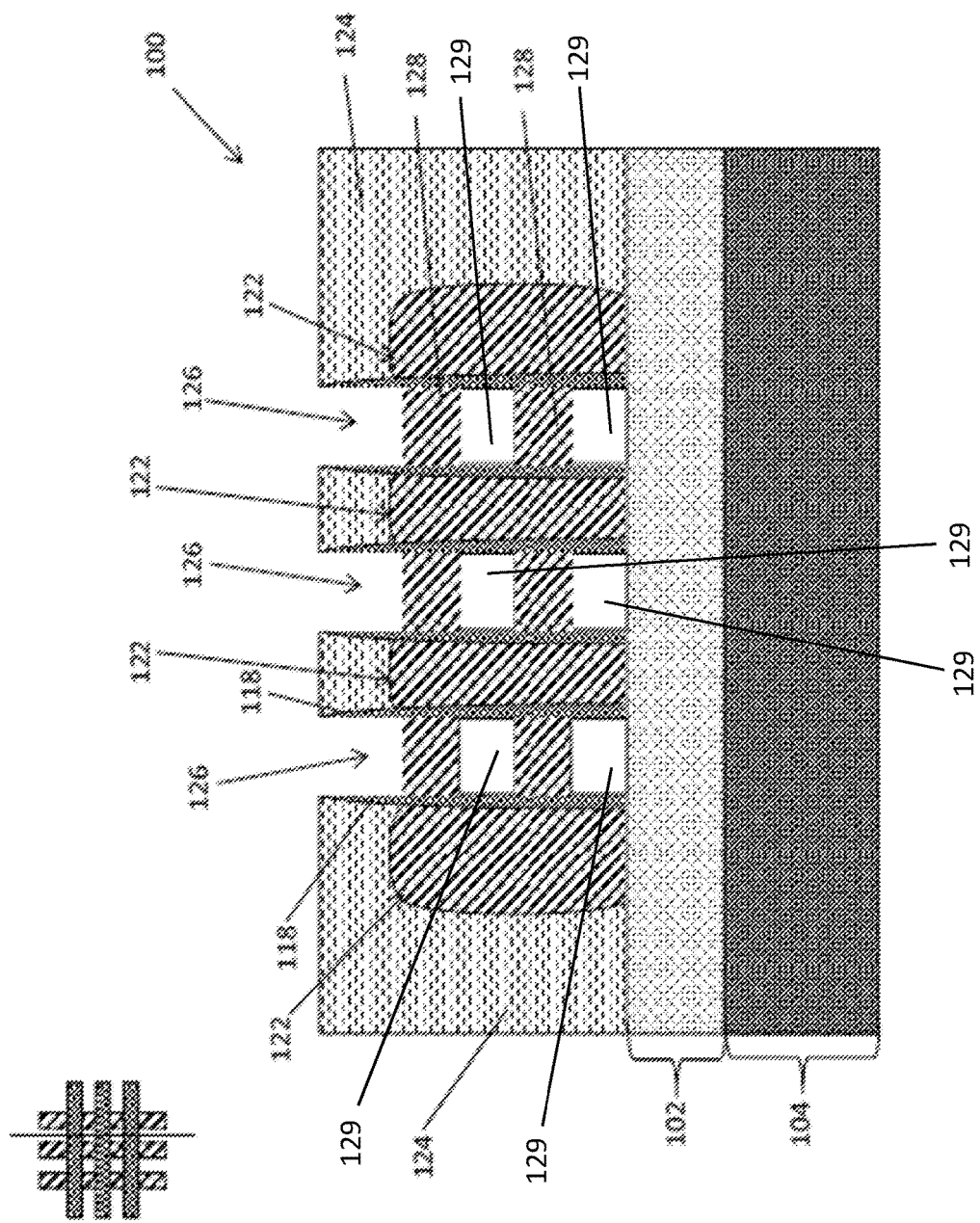
FIG. 10B illustrates the SOI wafer of FIG. 10A in the third orientation.

With reference now to FIGS. 10A-10B, the sacrificial fin portions (previously designated as element 108) are removed from the fins 112 to form voids 129 that define suspended nanowires 128 that are anchored to the replacement S/D regions 122. More specifically, a chemical etchant can be employed that exploits the lower oxidation potential of the sacrificial fin portions (e.g., the SiGe fin portions) compared to the active semiconductor fin portions (e.g., the Si fin portions). Examples of such etchants include, but are not limited to, a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the sacrificial fin portions can be selectively removed using a dry etching process such as oxygen ($O_2$) plasma etching or plasma chemistries typically used for etching. As mentioned above, the oxidized spacers 120 prevent the nanowire release from extending laterally into the replacement S/D regions 122. Accordingly, the sacrificial fin portions are removed while the replacement S/D regions 122 are preserved.

Figure 11A:
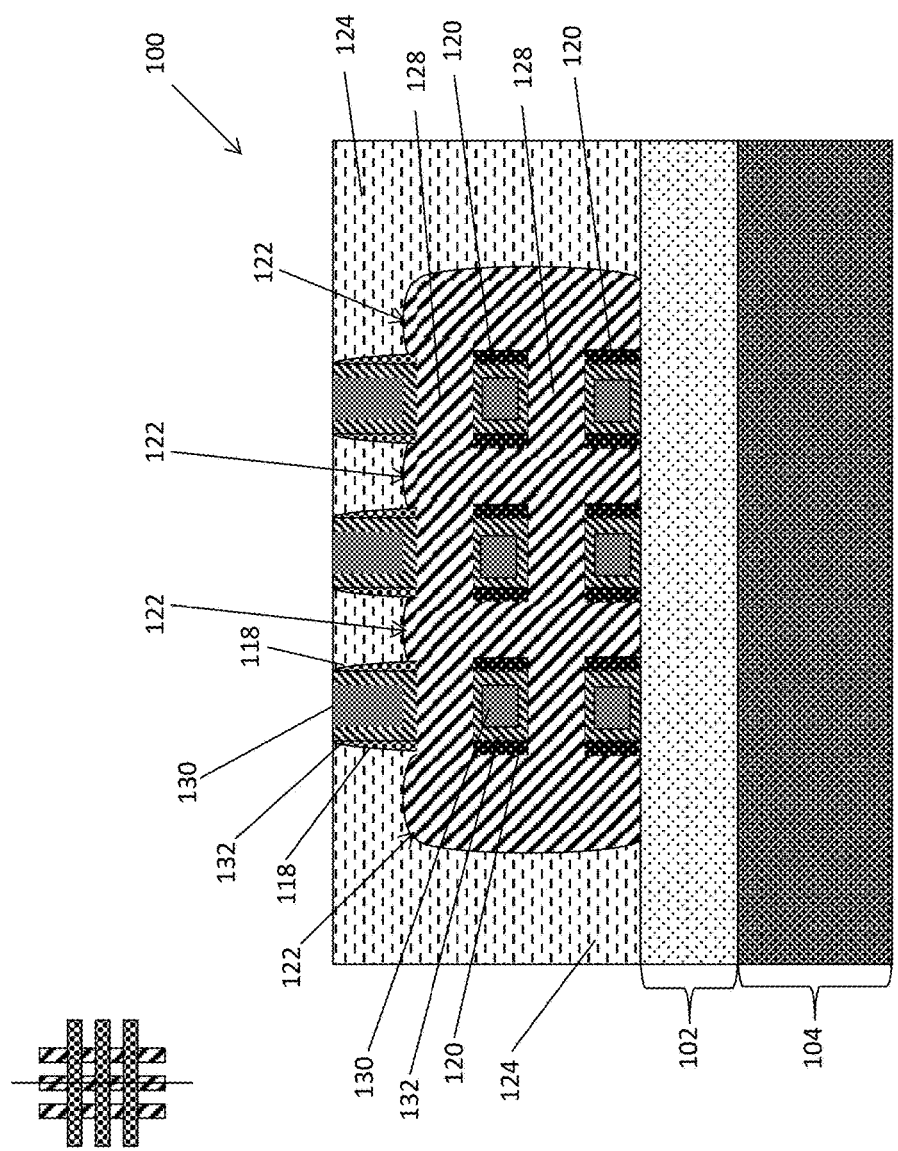
FIG. 11A illustrates the SOI wafer of FIGS. 10A-10B after forming replacement gates in the trenches surrounding the suspended nanowires.
Figure 11B:
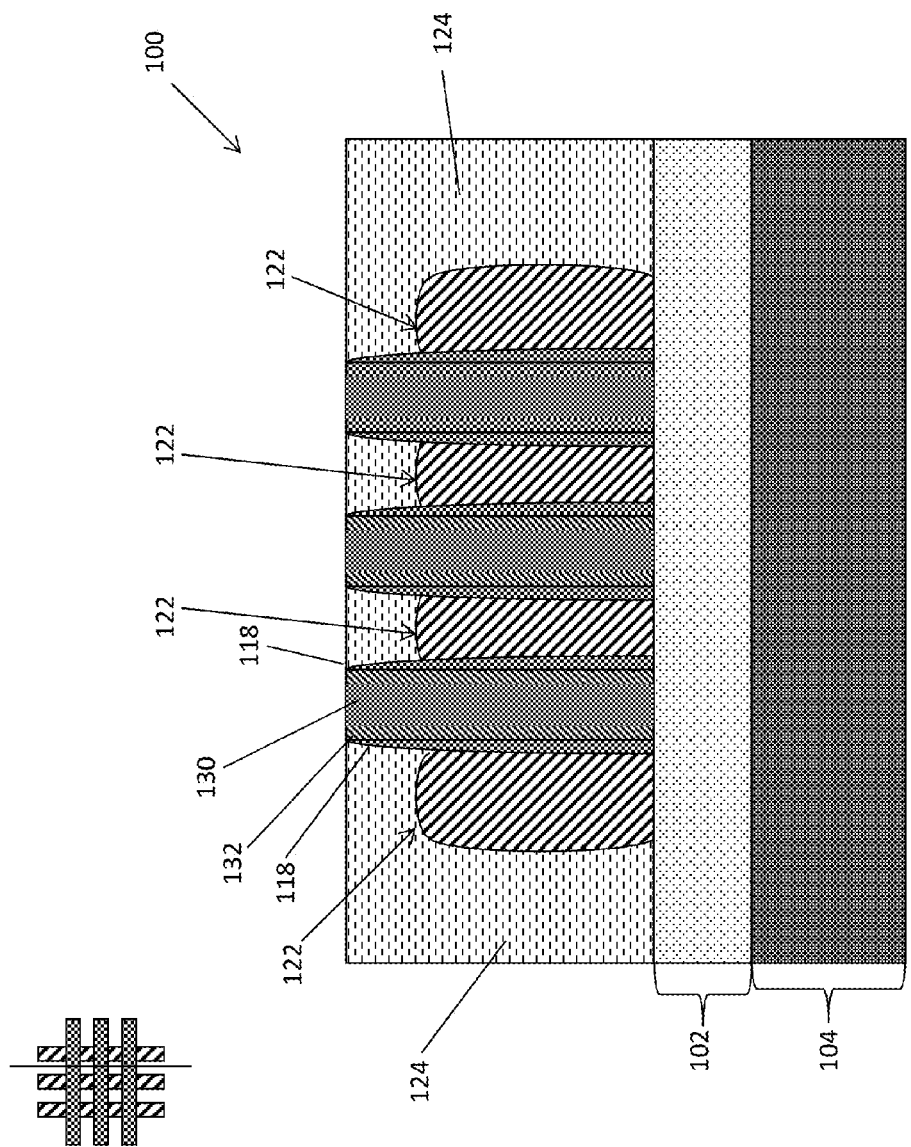

Turning to FIGS. 11A-11B, replacement gates 130 are subsequently formed in the trenches 126 surrounding the suspended nanowires 128. The replacement gates 130 are formed by first lining the trenches 126 and suspended nanowires 128 with a gate dielectric film 132. According to an exemplary embodiment, the gate dielectric film 132 is a high-k material, such as hafnium oxide ($HfO_2$) that is deposited using a conformal deposition process such as atomic layer deposition (ALD). In this manner, the oxide spacers 120 are interposed between the replacement source/drain regions 122 and the gate dielectric film 132.

Next, the trenches 126 are filled with a gate material 130 that completely surrounds the suspended nanowires 128. Once the trenches 126 are filled with the gate material 130, a CMP process is used to planarize the gate material deposited on the upper surface of the ILD material 124 and form replacement gate electrodes 130, i.e., the replacement gates 130. In this manner, a semiconductor device 100 having a gate-all-around configuration is formed. Moreover, the oxidized spacers 120 serve to electrically isolate the replacement gate 130 from the replacement source/drain regions 122. Suitable gate materials include, but are not limited to, one or more of polysilicon, a deposited metal(s), (such as titanium nitride (TiN)), and a hybrid stack of multiple materials such as metal polysilicon. Accordingly, at least one non-limiting embodiment provides a nanowire FET device including a plurality of nanotubes in a stacked arrangement to define a nanotube mesh that provides overall increased channel material compared to conventional nanowire FET devices. In this manner, the nanowire FET according to at least one embodiment of the invention provides increased current density compared to conventional nanowire FET devices.

As described above, various embodiments of the invention provide a gate-all-around nanowire field effect transistors (FETs) including oxidized spacers surrounding a respective metal gate electrode. The oxidized spacers are precisely located to protect replacement source/drain regions when releasing the nanowires during fabrication, while also serving to isolate the metal gate electrode from respective replacement source/drain regions. According to an embodiment, a method is provided that includes forming one or more stacked multi-layer semiconductor fins comprising a series of semiconductor fin portions and sacrificial fin portions. A selective oxidation process is then performed that forms oxidized spacers on sidewalls of the sacrificial fin portions. A replacement metal gate process is subsequently performed that forms a replacement metal gate process results in an nanowire FET having source/drain regions that are self-aligned with the metal gate electrode. Accordingly, a nanowire FET device is formed including a stacked nanotube mesh to provide overall increased channel material compared to conventional nanowire FET devices. In this manner, the nanowire FET according to at least one embodiment of the invention provides increased current density compared to conventional nanowire FET devices. Further, the internal oxidized spacer reduces parasitic capacitance, which will improve the power/performance of circuits built with these transistors compared to those without the internal spacer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device extending along a first direction to define a length, a second direction to define a width, and a third direction opposite the first and second directions to define a height, comprising:
   a first source/drain region and a second source/drain region, each on an upper surface of a wafer;
   a gate region interposed between the first and second source/drain regions;
   a plurality of nanowires, each nanowire having a first end anchored to the first source/drain region and an opposing second end anchored to the second source/drain region such that the at least one nanowire is suspended above the wafer in the gate region, the nanowire extending along the first direction to define a wire length and the second direction to define a wire width, the plurality of nanowires defining a stacked nanowire mesh including a first layer of nanowires interposed between the wafer and a second layer of nanowires;
   at least one gate electrode in the gate region, the gate electrode extending along the second direction and contacting an entire surface of the at least one nanowire to define a gate-all-around configuration;
   gate spacers on the sidewalls of the gate electrode, the gate spacers having a first thickness and extending along the second direction; and
   at least one pair of oxidized spacers having a second thickness and surrounding the at least one gate electrode to electrically isolate the at least one gate electrode from the first and second source/drain regions, the at least one pair of oxidized spacers extending along the second direction parallel with the gate spacers and on sidewalls of the gate electrode beneath the gate spacers, the second thickness of the at least one pair of oxidized spacers being equal to the first thickness of the gate spacers,
   wherein the first source/drain region and the second source/drain region are a single layer epitaxial material, and
   wherein the first source/drain region includes a first raised replacement source/drain and the second source/drain region includes a second raised replacement source/drain, the first and second raised replacement source/drain regions formed directly against the first end of every nanowire among the plurality of nanowires and the at least one pair of oxidized spacers.

2. The semiconductor device of claim 1, wherein the oxidized spacers comprise an oxidized semiconductor material.

3. The semiconductor device of claim 2, wherein the at least one nanowire comprises silicon (Si).

4. The semiconductor device of claim 3, wherein the oxidized spacers comprise silicon germanium oxide (SiGeO).

5. The semiconductor device of claim 2, wherein the at least one nanowire comprises silicon germanium (SiGe).

6. The semiconductor device of claim 5, wherein the oxidized spacers comprise silicon oxide (SiO).

7. The semiconductor device of claim 1 wherein the at least one pair of oxidized spacers surrounding the at least one gate electrode is interposed between the first nanowire layer and the second nanowire layer.

8. The semiconductor device of claim 1, wherein the wafer is a bulk semiconductor wafer.

9. The semiconductor device of claim 1, wherein the wafer is a semiconductor-on-insulator (SOI) wafer including a buried oxide layer interposed between a SOI layer and a bulk layer.

10. The semiconductor device of claim 1, wherein the single layer epitaxial material is silicon (Si).

11. The semiconductor device of claim 1, wherein the gate spacers include first inner sidewalls locate proximate to the gate electrode and first outer sidewalls located distally from the gate electrode, wherein the oxidized spacers include second inner sidewalls locate proximate to the gate electrode and second outer sidewalls located distally from the gate electrode, and wherein the first inner sidewalls of the gate spacers are vertically aligned with the second inner sidewalls of the oxidized spacers.

12. A semiconductor device extending along a first direction to define a length, a second direction to define a width, and a third direction opposite the first and second directions to define a height, comprising:
   a first source/drain region and a second source/drain region, each on an upper surface of a wafer;
   a gate region interposed between the first and second source/drain regions;

a plurality of nanowires, each nanowire having a first end anchored to the first source/drain region and an opposing second end anchored to the second source/drain region such that the at least one nanowire is suspended above the wafer in the gate region, the nanowire extending along the first direction to define a wire length and the second direction to define a wire width, the plurality of nanowires defining a stacked nanowire mesh including a first layer of nanowires interposed between the wafer and a second layer of nanowires;

at least one gate electrode in the gate region, the gate electrode extending along the second direction and contacting an entire surface of the at least one nanowire to define a gate-all-around configuration;

gate spacers on the sidewalls of the gate electrode, the gate spacers having a first thickness and extending along the second direction; and at least one pair of oxidized spacers having a second thickness and surrounding the at least one gate electrode to electrically isolate the at least one gate electrode from the first and second source/drain regions, the at least one pair of oxidized spacers extending along the second direction parallel with the gate spacers and on sidewalls of the gate electrode beneath the gate spacers, the second thickness of the at least one pair of oxidized spacers being equal to the first thickness of the gate spacers, wherein the first source/drain region includes a first raised replacement source/drain and the second source/drain region includes a second raised replacement source/drain, the first and second raised replacement source/drain regions formed directly against the first end of every nanowire among the plurality of nanowires and the at least one pair of oxidized spacers.

* * * * *